United States Patent [19]
Advani et al.

[11] Patent Number: 5,532,623
[45] Date of Patent: Jul. 2, 1996

[54] SENSE AMPLIFIER WITH READ CURRENT TRACKING AND ZERO STANDBY POWER CONSUMPTION

[75] Inventors: Manik Advani, Fremont; Cuong Trinh, Milpitas, both of Calif.

[73] Assignee: WaferScale Integration, Inc., Fremont, Calif.

[21] Appl. No.: 330,211

[22] Filed: Oct. 21, 1994

[51] Int. Cl.[6] .................................................. G01R 19/00
[52] U.S. Cl. .................... 327/51; 327/538; 365/189.01; 365/189.08; 365/189.11; 365/210
[58] Field of Search ................................ 327/51, 52, 538; 365/203, 204, 205, 210, 189.01, 185, 189.11

[56] References Cited

U.S. PATENT DOCUMENTS

| | | | |
|---|---|---|---|
| 3,949,381 | 4/1976 | Dennard et al. | 327/51 |
| 4,063,224 | 12/1977 | Kirschner | 365/184 |
| 4,223,394 | 9/1980 | Pathak et al. | 365/189.09 |
| 4,301,535 | 11/1981 | McKenny et al. | 365/185 |
| 4,404,659 | 9/1983 | Kihara et al. | 365/189.09 |
| 4,677,590 | 6/1987 | Arakawa | 365/210 |
| 5,042,011 | 8/1991 | Casper et al. | 365/205 |

*Primary Examiner*—John S. Heyman
*Assistant Examiner*—Kenneth B. Wells
*Attorney, Agent, or Firm*—Skjerven, Morrill, MacPherson, Franklin and Friel; Alan H. MacPherson; David T. Millers

[57] ABSTRACT

A sense amplifier includes: a pull-down device which contains a reference cell which is structurally identical to the PLD cells being sensed; and a pull-up device connected to form a current mirror which causes a saturation current of the pull-up device to be zero or greater than the current through the sensed cell. The pull-down device has a saturation current which tracks the current through the sensed cell. When current flows through the sensed cell, saturation current through the pull-up device exceeds the saturation current through the pull-down device, and an output node is pulled up. When no current flows through the sensed cell, no current flow through the pull-up device, and the pull-down device pulls the output node down. As a result, the sense amplifier exhibits a variable trip point which tracks variations cause by changes in device fabrication process, temperature, and power supply voltage. The reference cell in the sense amplifier conducts a current only during sensing, and therefore consumes no standby power.

21 Claims, 4 Drawing Sheets

SENSE AMPLIFIER WITH READ CURRENT TRACKING AND ZERO STANDBY POWER CONSUMPTION

BACKGROUND OF THE INVENTION

1. Field of the Invention

This invention relates to sense amplifiers for programmable logic devices and reading of non-volatile memory cells.

2. Description of Related Art

Programmable logic devices (PLDs) are user programmable devices which perform logical operations as required by a particular application of the PLD. FIG. 1 shows a conventional PLD 1 which generates product terms PT1 to PTM on output nodes 33. Product terms PT1 to PTM have values which are programmable logical combinations of input terms I1 to IK asserted on lines 11 of a PLD array 10. A user selects the logical combination for each product term PT1 to PTM by programming a corresponding column of PLD cells C11 ... C1N to CM1 ... CMN.

PLD cells C11 to CMN are conventional non-volatile memory cells such as EPROM cells, EEPROM cells, or Flash EPROM cells. Each PLD cell C11 to CMN has a programmed and an unprogrammed state indicated by whether the threshold voltage of the cell is high or low. Each of input terms I1 to IK and $\overline{I1}$ to $\overline{IK}$ is either high or low (logical value 1 or 0 respectively) and is applied to the gates, either the control gates of single transistor cells or the switching gates of multi-transistor cells, of PLD cells in a corresponding one of rows C11 ... CM1 to C1N ... CMN. If an input term on a gate of a cell is high and the cell is unprogrammed, the cell conducts. Otherwise, the cell does not conduct.

A sense amplifier 30 generates product term PT1 by sensing if any of cells C11 to C1N conducts when a particular set of input terms I1 to IK is applied. If none of cells C11 to C1N conducts, a transistor 22 and a cascoding device 26 pull the voltage on bit line 14 up to about 2 volts. Cascoding device 26 is an N-channel transistor having a drain connected through P-channel transistor 22 to a supply voltage Vcc. A gate of cascoding device 26 is coupled to a reference voltage PLDREF. When the voltage on bit line 14 reaches voltage PLDREF minus the threshold voltage of cascoding device 26, cascoding device 26 shuts off and stops pulling up the voltage on bit line 14. The voltage on bit line 14 is selected to protect cells C11 to C1N from a read disturb of the threshold voltages.

P-channel transistor 22 has a source coupled to supply voltage Vcc and a gate and a drain coupled together and to the drain of cascoding device 26. If none of cells C11 to C1N conduct, the gate of transistor 22 remains at about supply voltage Vcc minus the threshold voltage of transistor 22 so that transistor 22 is off. Sense amplifier 30 contains a P-channel transistor 31 and an N-channel transistor 32 having gates coupled through a line 24 to the gate of P-channel transistor 22. When there is no current through any of PLD cells C11 to C1N, the voltage on line 24 shuts off transistor 31 and turns on transistor 32, and transistor 32 pulls product term PT1 to low (approximately ground potential).

If at least one of cells C11 to C1N conducts, the conducting cell draws a current which pulls bit line 14 down. The dropping voltage is amplified by cascoding device 26 to cause an amplified signal on the gates of transistors 31 and 32 in sense amplifier 30. When the amplified signal applied to the gates of transistors 31 and 32 drops to a trip point, transistor 32 turns off, and transistor 31 turns on and pulls product term PT1 up to about supply voltage Vcc. An N-channel transistor 20 between the sources of cells C11 to C1N and ground has a gate coupled to bit line 14 and shuts off current through cells C11 to C1N if the voltage on bit line 14 drops to the threshold voltage of transistor 20. This keeps bit line 14 from reaching ground potential and speeds up recharging of bit line 14 if input terms I1 to IK change and stop all of cells C11 to C1N from conducting.

The rate at which bit line 14 is pulled down depends upon the saturation current through the conducting PLD cell or cells and the strength of pull-up transistor 22. Transistor 22 must supply less current than the minimum saturation current of a single one of cells C11 to C1N in order for bit line 14 to be pulled down. However, when input terms I1 to IK change from a state where at least one of cells C11 to C1N conduct to a state where none of cells C11 to C1N conduct, transistor 22 provides current that pulls bit line 14 up to a trip point where sense amplifier 30 pulls product term PT1 low. If transistor 22 is made weaker, the time to pull up the voltage of bit line 14 is longer, and the read time required for sense amplifier 30 to correctly generate product term PT1 is longer.

To improve the life of programming in cells C11 to CMN, a regulated supply voltage Vccr (not shown) may be applied to the control gate of the cells. Typically, in a 5-volt application, PLD cells C11 to CMN have a threshold voltage of about 1.5 volts in the unprogrammed state and an initial threshold voltage of about 6.5 volts in a programmed state, and regulated voltage Vccr is between about 3 and 4.5 volts. Using regulated voltage Vccr prolongs the life of the programming of cells C11 to CMN because even if charge leaks from a programmed cell and lowers the threshold voltage of a programmed cell from 6.5 volts to 5.5 volts, regulated voltage Vccr is lower than the threshold voltage and keep programmed cells off. In contrast, industry standard voltage supplies permit a 10% fluctuation in supply voltage Vcc. For a supply voltage Vcc which is 5.0±0.5 volts, fluctuations in the supply voltage can apply 5.5 volts to the control gate which causes cells having threshold voltage around 5.5 volts to conduct and causes PLD 1 to fail.

A problem with using regulated voltage Vccr is that the saturation current of cells C11 to C1N drops when the control gate voltage is lowered. This reduces the ability of a cell to pull down bit line 14. The problem is made worse when supply voltage Vcc is high and increases the strength pull-up strength of transistor 22 relative to the fixed saturation current of cells C11 to C1N. This requires that transistor 22 be made so small and weak that the read time (time to pull-up bit line 14) of PLD 1 is unacceptably long. If transistor 22 is not made this small, a single cell C11 to C1N may have a saturation current which is too small to pull down bit line 14 and trip sense amplifier 30, and this would cause PLD 1 to fail. Accordingly, a PLD sense amplifier system is needed which can function with an acceptable read time even when a regulated voltage is applied to cells of the PLD.

SUMMARY OF THE INVENTION

A sense amplifier in accordance with an embodiment of this invention automatically adjusts its trip point by tracking the read current in a PLD array. The sense amplifier includes a pull-up device and a pull-down device which are connected in series between a supply voltage and ground. An output node is between the pull-up and the pull-down device. The pull-down device contains a reference cell which is structurally identical to the PLD cells used in the PLD array, and causes the pull-down device to have a saturation current which tracks the current of a conducting cell in the PLD array. The pull-down device pulls the output node down to ground level unless the pull-up device conducts.

The pull-up device is connected to a transistor in the PLD array to form a current mirror which causes a saturation current of the pull-up device to be greater than the current in the PLD array (and therefore greater than the current of a conducting cell). Accordingly, when current flows through a cell in the PLD array, saturation current through the pull-up device automatically exceeds the saturation current through the pull-down device, and the output node is pulled up to about the supply voltage level. As a result, the sense amplifier exhibits a variable trip point and is able to automatically duplicate variations in the PLD cell's read current caused by variations in device fabrication process, temperature, and power supply voltage.

The sense amplifier accurately tracking the read current in the PLD array allows the control gates of PLD cells to be driven with a regulated voltage which is lower than the supply voltage and still provides an acceptable read time. Further, the reference cell in the sense amplifier conducts a current only when the sense amplifier is functioning, and the current tracking function of the sense amplifier consumes no standby power.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
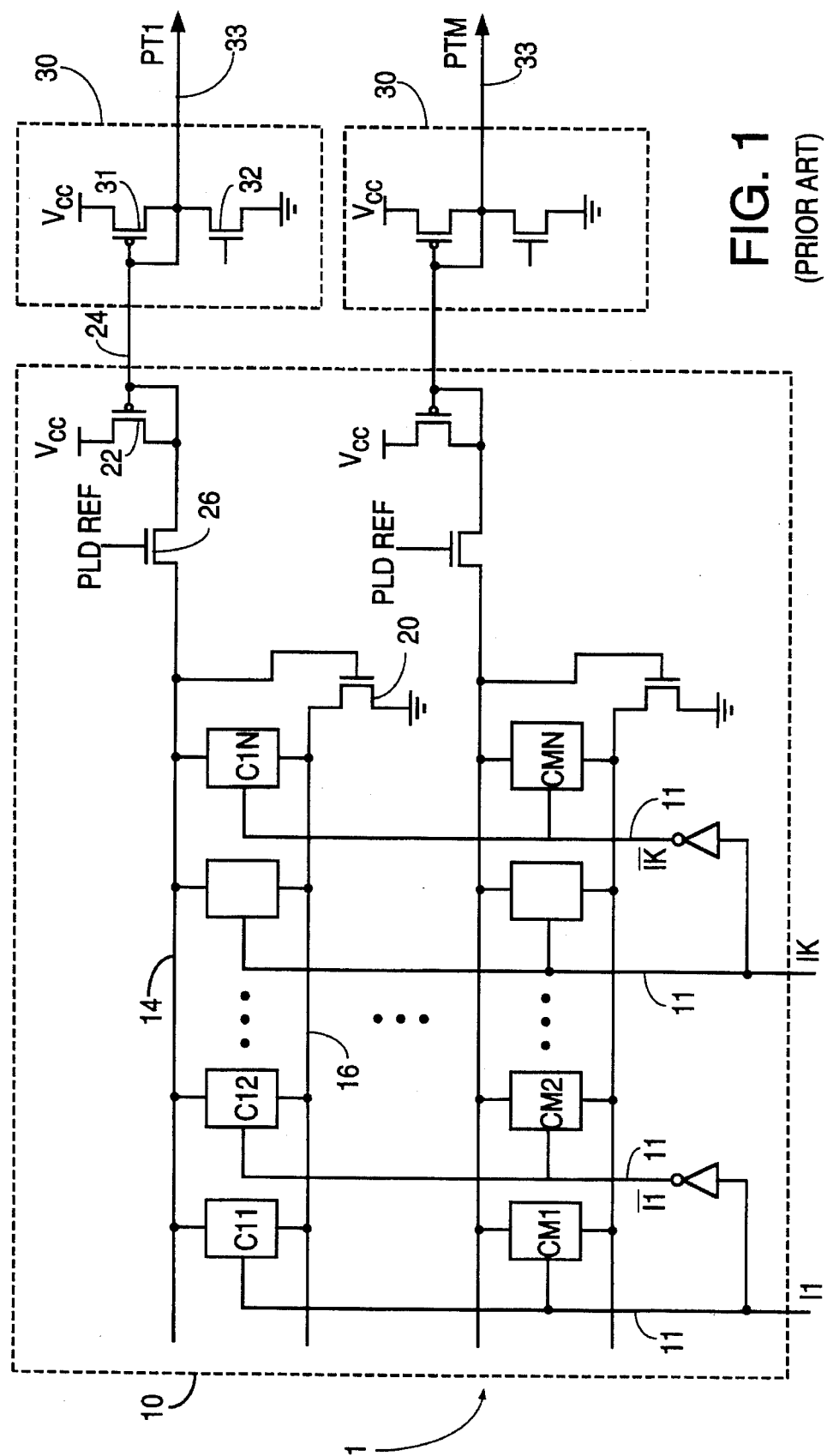
FIG. 1 is a schematic diagram of a prior art programmable logic device.
Figure 2:
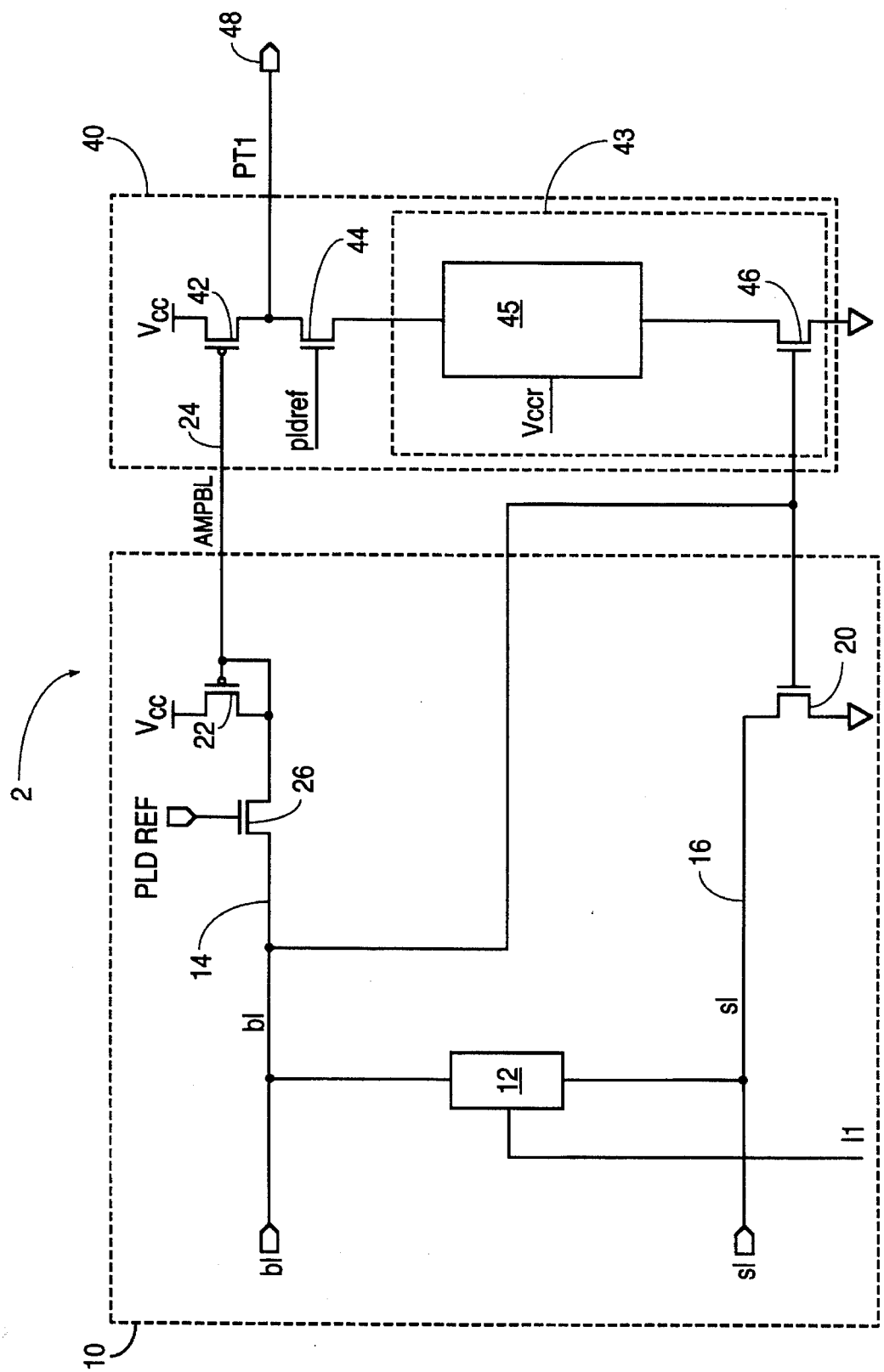
FIG. 2 is a schematic diagram of a programmable logic device utilizing a sense amplifier in accordance with an embodiment of this invention.

FIG. 2 shows a programmable logic device (PLD) array 10 and a sense amplifier 40 in accordance with an embodiment of this invention. PLD array 10 is identical to and operates in the same manner as PLD array 10 of FIG. 1, and the above description of PLD array 10 in regard to FIG. 1 also applies here to PLD 10 of FIG. 2. For simplicity of illustration, only a single PLD cell 12 is shown in FIG. 2 to represent the column of PLD cells C11 to C1N in FIG. 1. The remaining columns such as column CM1 . . . CMN of FIG. 1 are omitted from FIG. 2.

Sense amplifier 40, includes a pull-up device 42 and a pull-down device 43 which are connected in series between a supply voltage Vcc and ground. An output node 48 of sense amplifier 40 is between pull-up device 42 and pull-down device 43 and carries the product term signal PT1.

Pull-down device 43 contains N-channel transistors 44 and 46, and a reference cell 45. Transistor 44 is identical to cascoding device 26, has a drain coupled to output terminal 48, and has a gate driven by reference voltage PLDREF, the same voltage applied to the gate of cascoding device 26. Reference cell 45 is structurally identical to PLD cell 12, is unprogrammed, and has a control gate voltage that is the same as the control gate voltage for a conducting PLD cell (i.e. a cell which is unprogrammed and has a corresponding input term at voltage Vccr). Transistor 46 is identically matched with transistor 20. If PLD cell 12 conducts, pull-down device 43 is structurally identical to a portion of array 10 including cascoding device 26, PLD cell 12, and transistor 20 and has a saturation current that tracks the current through PLD cell 12. In alternative embodiments, a pull-down device similarly contains elements matching those in an array being read.

Pull-up device 42 is a P-channel transistor 42 having a source coupled to supply voltage Vcc and a gate coupled to the gate of transistor 22. When operated in the saturation region, transistor 42 mirrors the current through transistor 22. Transistor 42 has a larger channel width-to-length ratio than does transistor 22, so that the saturation current through transistor 42 is a multiple (typically about 2) of the current through transistor 22. When at least one of PLD cells 12 coupled between bit line 14 and source line 16 conducts, the current through transistor 22 equals the current in the bit line 14, and the saturation current of transistor 42 is greater than the bit line current and therefore greater than the current through a single conducting PLD cell.

If current flows through transistor 22, pull-up device 42 has a saturation current that is greater than the saturation current of pull-down device 43 and therefore pulls output terminal 48 up to about supply voltage Vcc, a voltage level suitable for CMOS applications. If no current flows through any cell 12, then transistor 22 and pull-up device 42 are off, and pull-down device 43 pulls output terminal 48 down to about ground potential.

Reference cell 45 like PLD cell 12 may be any type of floating gate semiconductor device such as an EPROM cell, an EEPROM cell, or a flash memory cell, as long as PLD cell 12 and reference cell 45 are identical. In the embodiment of FIG. 2, PLD cell 12 and reference cell 45 are single transistor floating gate memory cells. Reference cell 45 has a control gate voltage equal to regulated voltage Vccr. PLD cell 12 has a control gate voltage which depends on an input term I1. If the input term is high (or low), then the control gate voltage of PLD cell 12 is regulated voltage Vccr (or ground).

In accordance with the embodiment of FIG. 2, transistor 22 is no longer required to be weaker than the lowest possible current through a single conducting PLD cell 12. Even if a conducting PLD cell 12 does not draw a high enough current to pull bit line 14 to a low voltage in the required read time, any current through cell 12 (and therefore through transistor 22) causes pull-up device 42 to have a saturation current that is greater than the current through PLD cell 12 so that pull-up device 42 pulls up product term PT1. In contrast, pull-down device 43 has a saturation current that tracks current through a conducting cell 12 in array 10 and is automatically less than the saturation current of pull-up device 42. Transistor 22 can be made large to provide a quicker charge of bit line 14 when input terms I1 change and stop all cells 12 from conducting. Additionally, a lower regulated voltage Vccr can be used to provide a greater margin for charge loss and a longer programming life.

PLD array 10 and sense amplifier 40 can also be operated at either a 5-volt or a 3-volt supply voltage Vcc without alteration. In the prior art of FIG. 1, supply voltage was critical because supply voltage Vcc controlled both the strength of transistor 22 as a pull-up device and the trip points of sense amplifier 30. Since sense amplifier 40 of FIG. 2 mirrors any fluctuations in the operating characteristics of PLD array 10, problems caused by a low supply voltage Vcc are eliminated. This capability allows a low voltage power source to supply PLD array 10 and sense amplifier 40 with all internal drive voltages without requiring an internal charge pump.

Further, using reference cell 45 to track the read current, provides greater immunity to variations in the process which forms PLD 2, in the supply voltage Vcc, and in the operating temperature. Reference cell 45 tends to vary in the same manner as PLD cells 12 so that the trip point of sense amplifier 40 adjusts to cancel out common mode variations.

Figure 3:
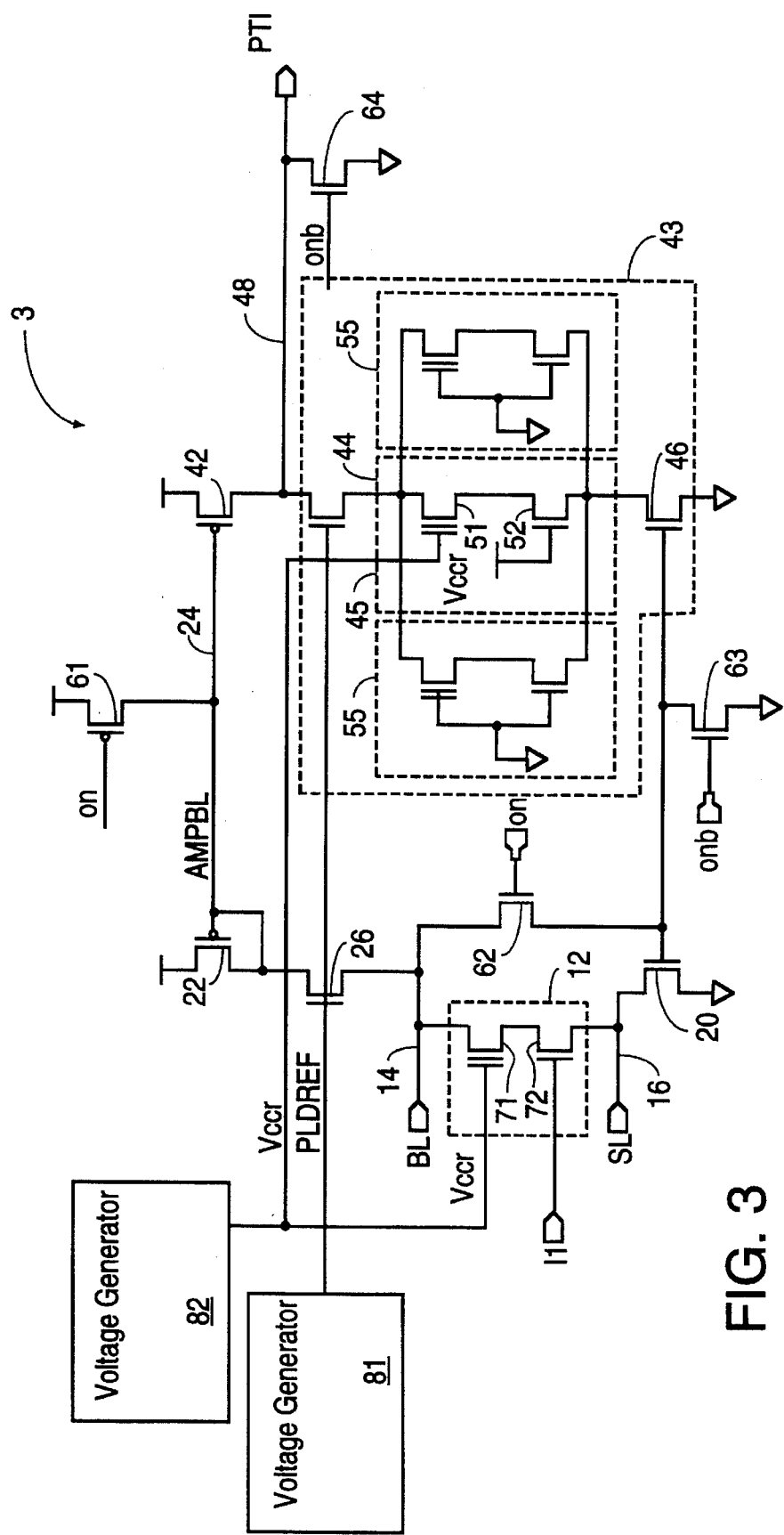
FIG. 3 is a schematic diagram of a programmable logic device utilizing a sense amplifier in accordance with another embodiment of this invention.

FIG. 3 shows schematic of a PLD 3 in accordance with another embodiment of this invention. PLD 3 contains many elements which have the same reference numbers as used in FIG. 2 and which are the same or similar to elements described in regard to FIG. 2. The above description of those elements also applies here to PLD 3 of FIG. 3.

In FIG. 3, reference cell 45 and PLD cells 12 are two-transistor memory cells including floating gate transistors 51 and 71 and N-channel switching transistors 52 and 72. In operation, a control gate of reference cell 45 is biased at regulated voltage Vccr which in a 5-volt application is between about 3 and about 4.5 volts, and the gate of switching transistor 52 in reference cell 45 is biased at supply voltage Vcc so that reference cell 45 conducts. All of PLD cells 12 have floating gate transistors 71 with control gates at regulated voltage Vccr and switching transistors 72 at a voltage that is either grounded or at supply voltage Vcc depending on whether the input term I1 corresponding to PLD cell 12 is low or high.

Reference cell 45 is between a pair of dummy cells 55 which are identical to reference cell 45 and PLD cells 12. Dummy cells 55 have control gates and switching gates coupled to ground so that they do not conduct, however, dummy cells 55 ensure that reference cell 45 functions equivalently to a PLD cell within an array. Since reference cell 45 is formed between cells 55, reference cell 45 more closely matches the structure and process variations in PLD cells 12 which are between other PLD cells 12.

In an example embodiment, N-channel transistors 20 and 46 have channel widths of 8.5 μm and lengths of 0.9 μm. N-channel transistors 26 and 44 have channel widths of 15 μm and lengths of 0.9 μm. P-channel transistor 22 has an effective channel width of 8 μm and a length of 1.1 μm, and P-channel transistor 42 has an effective channel width of 17.5 μm and a length of 1.1 μm, more than twice width-to-length ratio of transistor 22. Floating gate transistor 51 has a channel width of 5.3 μm and length of 0.87 μm, and switching transistor 52 has channel width of 4.7 μm and length of 0.9 μm.

Figure 4:
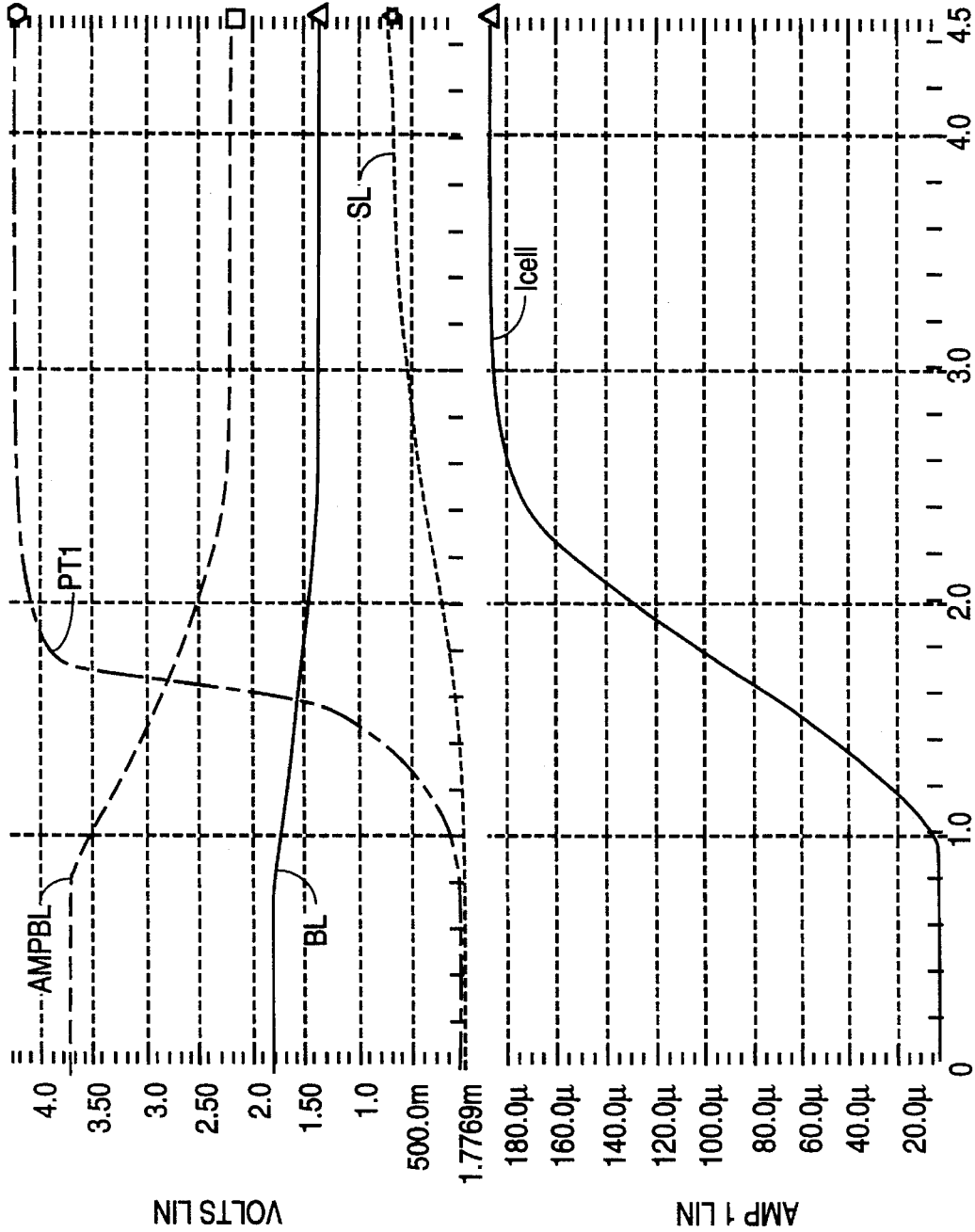
FIG. 4 shows plots of current and voltage signals during reading of a product term in the programmable logic device of FIG. 3.

FIG. 4 shows plots of cell current Icell and signals in PLD 3 (FIG. 3) during a read of cell 12 where cell 12 is unprogrammed and the voltage of an input term I1 applied to the gate of switching transistor 72 rises from 0 volts to 4.5 volts (supply voltage Vcc). Initially, current Icell through unprogrammed cell 12 and through transistor 22 is zero, and product term PT1 and a source line signal SL on source line 16 are near ground. Cascoding device 26 limits a bit signal BL on bit line 14 to about 1.8 volts, and an amplified bit signal AMPBL on line 24 is about 3.7 volts which is supply voltage Vcc minus the threshold voltage of transistor 22.

When the input term rises to the threshold voltage of switching transistor 72, current Icell begins to increase, and the saturation current of transistor 42 rises which pull-up product term PT1. At the same time, bit signal BL and amplified bit signal AMPBL fall. When current Icell through conducting cell 12 reaches a saturation value of about 180 μA, product term PT1 is about 4.3 volts, amplified bit signal AMPBL is about 2.2 volts, and bit signal BL is about 1.4 volts.

PLD 3 also has a low standby power consumption. Transistors 61 to 64 are for switching PLD 3 into a standby mode where the only power consumption is for generation of reference voltage PLDREF and regulated voltage Vccr. When a signal ON is high and signal ONB is low, P-channel transistor 61 and N-channel transistors 63 and 64 are off, and N-channel transistor 62 is on, and PLD 3 operates as described above.

When signal ON is low and signal ONB is high, PLD 3 is in standby mode. P-channel transistor 61 raises signal AMPBL high and shuts off transistors 22 and 42. N-channel transistor 63 lowers the gate voltage of transistors 20 and 46 and therefore disconnects source line 16 from ground. Transistor 62 disconnects bit line 14 from the gates of transistors 20 and 46, and transistor 64 grounds output node 48 to prevent product term PT1 from floating.

The sense amplifier of PLD 3 consumes no power in standby mode. This differs from using a reference voltage generator to track cell current. More particularly, using a reference voltage generator which tracks cell current generally requires a reference cell which conducts a current. The current through the reference cell determines the generated reference voltage, and a current mirror circuit causes sense amplifiers for each product term to track the reference voltage. Such reference voltage generators typically cannot be turned off when a PLD goes into standby mode because turning on the reference voltage generator charges a relatively high capacitance, the gates of transistors in a large number of sense amplifiers. Accordingly, switching a voltage reference generator off in standby mode then on for operation takes an undesirably long time. Leaving the reference voltage generator on during standby mode draws a relatively large current because the reference cell would typically be identical to the PLD cells and would typically draw more than 100 μA.

In PLD 3, no current flows through reference cells 45 when in standby mode. This is possible because reference cell 45 is part of a pull-down device that is only active in operation. In standby mode, the only active reference voltage generators 81 and 82 in PLD 3 provide voltages PLDREF and Vccr which draw a relatively small current because voltages PLDREF and Vccr do not require a low impedance device such a PLD cell.

Although the present invention has been described with reference to particular embodiments, the description is only an example of the invention's application and should not be taken as a limitation. In particular, although the sense amplifiers described operate in the context of a PLD array, other embodiments of the invention include sense amplifiers applied in conventional memories such as EPROM, EEPROM, and flash memory. Various other adaptations and combinations of features of the embodiments disclosed will be apparent to those skilled in the art and are within the scope of the present invention as defined by the following claims.

We claim:

1. A circuit for reading a state of a memory cell, the circuit comprising:
   a first transistor having a drain and a gate coupled together;
   means for connecting the first transistor to the memory cell, wherein the first transistor is connected between a power supply terminal and the memory cell;
   a second transistor connected between the power supply terminal and an output node, wherein the second transistor has a gate coupled to the gate of the first transistor and a channel width-to-length ration which is greater than that of the first transistor; and
   a pull-down device coupled between the output node and a ground terminal, the pull-down device comprising a reference cell which is structurally identical to the memory cell.

2. The circuit of claim 1, wherein the means for connecting comprises a cascoding device coupled between the first transistor and the memory cell, the, pull-down device further comprises a third transistor coupled between the output node and the reference cell, and the circuit further comprises a voltage generator which provides a reference voltage to a gate of the cascoding device and to a gate of the third transistor.

3. The circuit of claim 2, wherein the pull-down device further comprises a fourth transistor coupled between the reference cell and the ground terminal.

4. The circuit of claim 3, wherein the reference cell and the memory cell comprise structurally identical floating gate semiconductor devices.

5. The circuit of claim 4, wherein the first and second transistors are P-channel transistors.

6. The circuit of claim 1, further comprising a voltage generator which generates a regulated voltage that is lower than a supply voltage for the circuit, wherein the regulated voltage is applied to control gates of the memory cell and the reference cell during reading of the memory cell.

7. The circuit of claim 6, wherein the regulated voltage is between about 3 volts and about 4.5 volts.

8. The circuit of claim 7, wherein the supply voltage fluctuates over a range from approximately 4.5 volts to approximately 5.5 volts.

9. A programmable logic device comprising:
   a bit line;
   a source line;
   a PLD cell having first and second terminals coupled respectively to the bit line and the source line;
   a first transistor coupled between the bit line and a supply voltage terminal, the first transistor having a drain and a gate coupled together and a source coupled to the supply voltage terminal;
   a second transistor having a source coupled to the supply voltage terminal, a gate coupled to the gate of the first transistor, and a drain coupled to an output terminal, wherein the second transistor has a larger channel width-to-length ratio than that of the first transistor; and
   a reference cell between the output terminal and ground potential, wherein the reference cell has a saturation current that tracks a current through a conducting PLD cell.

10. The programmable logic device of claim 9, wherein the reference cell and the PLD cell are structurally identical floating gate semiconductor devices.

11. The programmable logic device of claim 10, further comprising:
    a first cascoding device coupled between the bit line and the drain of the first transistor; and
    a second cascoding device coupled between the output terminal and the reference cell.

12. The programmable logic device of claim 11, further comprising:
    a third transistor coupled between the source line and the ground potential; and
    a fourth transistor coupled between of the reference cell and the ground potential.

13. The programmable logic device of claim 12, wherein gates of the third and fourth transistors are coupled to the bit line.

14. The programmable logic device of claim 13, further comprising a plurality of additional PLD cells coupled between the bit line and the source line, wherein each of the plurality of additional PLD cells is structurally identical to the PLD cell.

15. The programmable logic device of claim 9, further comprising a voltage generator which generates a regulated voltage that is lower than a supply voltage for the programmable logic device, wherein the voltage generator provides the regulated voltage to control gates of the reference cell and the memory cell.

16. The programmable logic device of claim 15 wherein:
    the PLD cell further comprises a floating gate transistor and a switching transistor connected in series, wherein a control gate of the floating gate transistor is coupled to the voltage generator and a gate of the switching transistor receives an input term; and
    the reference cell further comprises a second floating gate transistor and a second switching transistor connected in series, wherein a control gate of the second floating gate transistor is coupled to the voltage generator and a gate of the second switching transistor is coupled to the supply voltage terminal.

17. A method for reading a state of a memory cell, comprising:
    applying to a gate of a pull-up device a first voltage which causes the pull-up device to have a saturation current which is proportional to a current through the memory cell;
    connecting a reference cell in series with the pull-up device, wherein the reference cell is structurally identical to the memory cell;
    applying voltages to the reference cell which cause the reference cell to have a saturation current which tracks current through a conducting memory cell; and
    reading the state of the memory cell at a node between the pull-up device and the reference cell.

18. The method of claim 17, wherein applying the first voltage to the gate of a pull-up device comprises:
    connecting a transistor in series with the memory cell and between the memory cell and a supply voltage, wherein the transistor has a smaller channel width-to-length ratio than does the pull-up device;
    connecting the gate and drain of the transistor together; and
    connecting the gate of the pull-up device to the gate of the transistor.

19. The method of claim 18, wherein applying voltages to the reference cell comprises applying to a control gate of the reference cell the same voltage as is applied to a control gate of the memory cell.

20. The method of claim 19, wherein applying voltages to the reference cell comprises applying to the control gate of the reference cell a voltage that is less than a supply voltage for a circuit containing the reference cell.

21. The method of claim 18, wherein the reference cell and the memory cell are structurally identical floating gate semiconductor devices, and the method further comprises setting a threshold voltage of the reference cell equal to a threshold voltage of an unprogrammed state of the memory cell.

* * * * *